(12) United States Patent
Kim

(10) Patent No.: US 9,214,216 B2
(45) Date of Patent: Dec. 15, 2015

(54) SEMICONDUCTOR DEVICE AND OPERATION METHOD THEREOF

(71) Applicant: SK hynix Inc., Gyeonggi-do (KR)

(72) Inventor: Chang-Hyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 69 days.

(21) Appl. No.: 14/106,111

(22) Filed: Dec. 13, 2013

(65) Prior Publication Data

US 2015/0003180 A1    Jan. 1, 2015

(30) Foreign Application Priority Data

Jun. 28, 2013 (KR) ........................ 10-2013-0075557

(51) Int. Cl.
 *G11C 7/00* (2006.01)
 *G11C 11/406* (2006.01)
 *G11C 29/00* (2006.01)
 *G11C 16/32* (2006.01)

(52) U.S. Cl.
 CPC ........ *G11C 11/406* (2013.01); *G11C 11/40607* (2013.01); *G11C 11/40618* (2013.01); *G11C 16/32* (2013.01); *G11C 29/783* (2013.01); *G11C 2211/4061* (2013.01)

(58) Field of Classification Search
 CPC ........... G11C 11/406; G11C 11/40618; G11C 11/40607; G11C 16/32; G11C 29/783; G06F 12/0246

USPC ........ 365/222, 185.11, 149, 189.011, 230.01, 365/230.03, 233.1

See application file for complete search history.

(56) References Cited

U.S. PATENT DOCUMENTS

| 7,565,479 | B2 * | 7/2009 | Best ..................... G11C 11/406 711/103 |
| 8,264,903 | B1 * | 9/2012 | Lee et al. ....................... 365/222 |
| 2008/0170431 | A1 * | 7/2008 | Sheu et al. .................... 365/163 |
| 2010/0115206 | A1 * | 5/2010 | de la Iglesia et al. ......... 711/137 |
| 2011/0007592 | A1 * | 1/2011 | Tashiro ......................... 365/222 |
| 2013/0094317 | A1 * | 4/2013 | Lee .............................. 365/222 |
| 2013/0279284 | A1 * | 10/2013 | Jeong ................... G11C 11/402 365/222 |
| 2014/0064009 | A1 * | 3/2014 | Lee .............................. 365/222 |

FOREIGN PATENT DOCUMENTS

KR    1020110076321    7/2011

* cited by examiner

*Primary Examiner* — Fernando Hidalgo

(74) *Attorney, Agent, or Firm* — IP & T Group LLP

(57) ABSTRACT

A semiconductor device includes: a plurality of memory cell blocks, a counting unit suitable for counting the number of active operations on each of the memory cell blocks, based on an active command and a row address, and a refresh control unit suitable for determining a target memory cell block among the memory cell blocks and controlling an additional refresh operation for the target memory cell block to be performed based on the counting result.

7 Claims, 2 Drawing Sheets

SEMICONDUCTOR DEVICE AND OPERATION METHOD THEREOF

CROSS-REFERENCE TO RELATED APPLICATIONS

The present application claims priority of Korean Patent Application No. 10-2013-0075557, filed on Jun. 28, 2013, which is incorporated herein by reference in its entirety.

BACKGROUND

1. Field

Exemplary embodiments of the present invention relate to a semiconductor design technology, and more particularly, to a semiconductor device and an operation method thereof.

2. Description of the Related Art

In general, a semiconductor device such as dynamic random access memory (DRAM) includes a great number of memory cells, and each of the memory cells includes a switching transistor and a capacitor serving as a data storage. Since a leakage current occurs due to the structure of the memory cell such as a PN junction of the transistor, data stored in the capacitor may be lost. Thus, the semiconductor device requires a refresh operation for restoring data in a memory cell before the data is lost. Hereafter, the refresh operation is referred to as a normal refresh operation.

The normal refresh operation includes an auto refresh operation and a self refresh operation. The auto refresh operation refers to an operation mode in which the semiconductor device performs a refresh operation in response to a refresh command applied from an outside. The self refresh operation refers to an operation mode in which the semiconductor device performs a refresh operation while sequentially changing an internal address in response to a refresh command applied from the outside.

Recently, an additional refresh operation is performed on a row (or a word line) in which the corresponding cell data are highly likely to be lost due to a row hammering (or a word line disturbance), in addition to the normal refresh operation. The row hammering refers to a phenomenon in which data of memory cells connected to a target row (i.e., a row with a large number of activations or a high activation frequency) and adjacent rows may be degraded due to the repeated activations on the row. Conventionally, counters are provided for the respective rows to prevent the data degradation by the row hammering, and an additional refresh operation is performed on a target row, which is activated a predetermined number of times or more, and adjacent rows, which are disposed adjacent to the target row. Such additional refresh operation is typically referred to as a target row refresh (TRR) operation (or a TRR mode). However, in order to supporting the TRR operation, a plurality of counters are required to be provided for the respective rows, and thus a circuit area occupied by the counters inevitably increases.

SUMMARY

Various embodiments are directed to a semiconductor device that may mitigate a row hammering while occupying a smaller circuit area, and an operation method thereof.

In an embodiment, a semiconductor device may include a plurality of memory cell blocks, a counting unit suitable for counting the number of active operations on each of the memory cell blocks, based on an active command and a row address, and a refresh control unit suitable for determining a target memory cell block among the memory cell blocks and controlling an additional refresh operation for the target memory cell block to be performed based on the counting result.

In an embodiment, a semiconductor device may include a plurality of mats, a counting unit suitable for counting the number of active operations on each of the mats, based on an active command and a row address, a target mat determination unit suitable for generating a mat information signal corresponding to a target mat among the mats and an enable signal for enabling an additional refresh operation based on the counting result, and a refresh operation unit suitable for generating a row active signal and a refresh address for controlling a normal refresh operation for the mats and the additional refresh operation for the target mat, based on the mat information signal, the enable signal, a refresh command.

In an embodiment, an operation method of a semiconductor device with a plurality of memory cell blocks each having a plurality of rows, the operation method may include counting the number of active operations on the corresponding memory cell block, determining a memory cell block, which is activated a predetermined number or more, as a direct target cell block based on the counting result, and performing an additional refresh operation on the target cell block, when a refresh command is inputted.

In an embodiment, a semiconductor device may include a plurality of memory cell blocks, each of which has a plurality of rows, a plurality of counters each suitable for counting the number of active operations on the corresponding memory cell block based on an active command and a row address, and a refresh control unit suitable for determining a target memory cell block and performing an additional refresh operation on the target memory cell block, based on counting signals generated from the counters.

DETAILED DESCRIPTION

Figure 1:
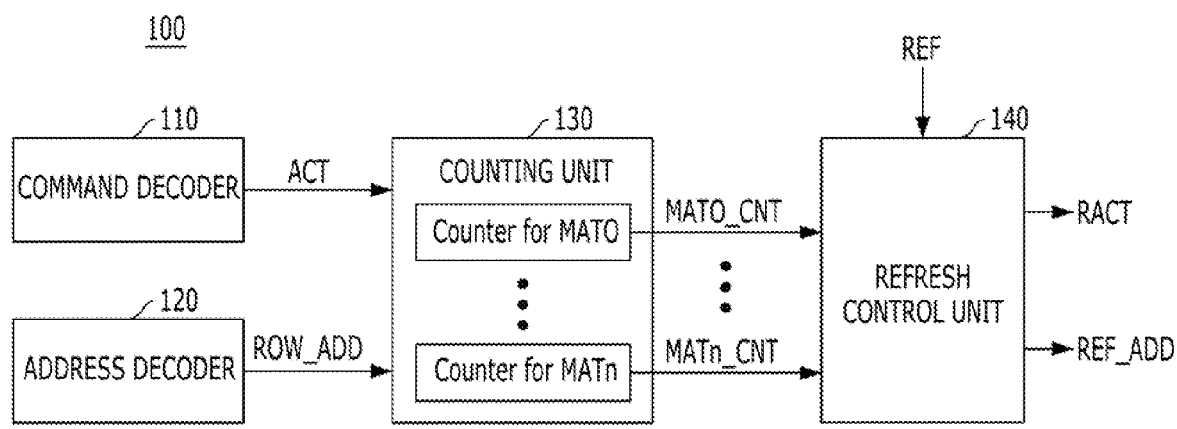
FIG. 1 is a block diagram illustrating a semiconductor device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram illustrating a semiconductor device in accordance with an embodiment of the present invention.

Referring to FIG. 1, the semiconductor device 100 may include a plurality of memory banks (not illustrated), a command decoder 110, an address decoder 120, a counting unit 130, and a refresh control unit 140. Each of the memory banks includes a plurality of memory cell blocks (e.g., mats), each of which has a plurality of rows. The command decoder 110 may generate an internal active command ACT in response to external commands (not illustrated). The address decoder 120 may generate a row address ROW_ADD in response to an external address (not illustrated). The counting unit 130 may count the number of active operations (i.e. how many times activated) on the respective mats (i.e., on the rows included in the respective mats) based on the internal active command ACT and the row address ROW_ADD. The refresh control unit 140 may determine a target mat requiring an additional refresh operation among the mats based on the counting result by the counting unit 130 and perform the additional refresh operation on the target mat. Hereafter, the additional refresh operation is referred to as a target mat refresh (TMR) operation.

The counting unit 130 may be provided for each of the memory banks. Alternatively, the counting unit 130 may be provided for any one of the memory banks, in the case in which the memory banks perform a burst operation, so that the rows having same row address is activated at the respective memory banks. Hereafter, a target mat of a bank, which is directly counted by the counting unit 130, is referred to as a direct target mat, and a target mat of a bank, which is not directly counted by the counting unit 130 is referred to as an indirect target mat. Furthermore, the counting unit 130 may include a plurality of counters one-to-one corresponding to the mats.

The refresh control unit 140 controls a normal refresh operation and a TMR operation to be performed on the banks based on a refresh command REF and a plurality of mat counting signal MAT0_CNT to MATn_CNT outputted from the counting unit 130.

Figure 2:
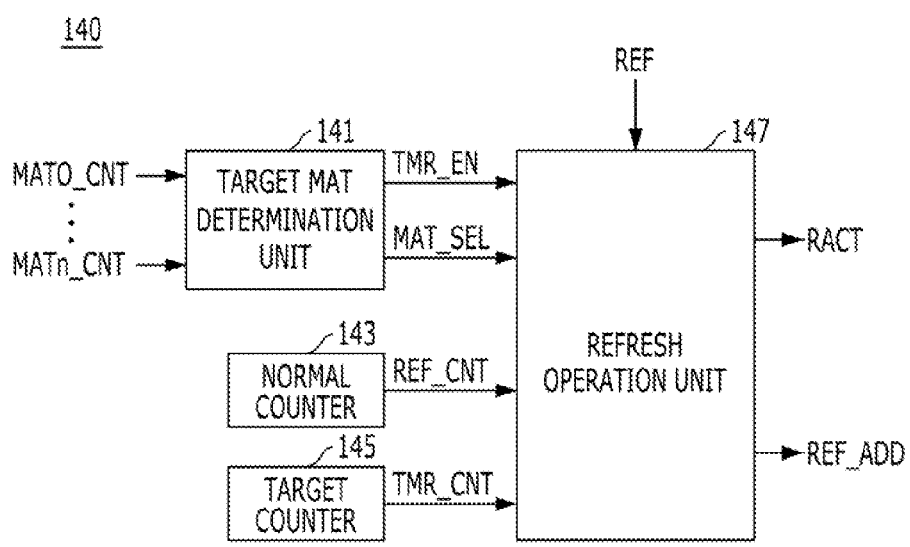
FIG. 2 is a detailed diagram illustrating a refresh control unit shown in FIG. 1.

FIG. 2 is a detailed diagram illustrating the refresh control nit 140 shown in FIG. 1.

Referring to FIG. 2, the refresh control unit 140 may include a target mat determination unit 141, a normal counter 143, a target counter 145, and a refresh operation unit 147. The target mat determination unit 141 may generate a mat information signal MAT_SEL corresponding to a direct target mat and an enable signal TMR_EN for controlling whether or not to perform a TMR operation based on the mat counting signals MAT0_CNT to MATn_CNT. The normal counter 143 may count the number of normal refresh operations and generate a normal refresh counting signal REF_CNT. The target counter 145 may count the number of TMR operations and generate a TMR counting signal TMR_CNT. The refresh operation unit 147 may generate a row active signal RACT and a refresh address REF_ADD for controlling a normal refresh operation and a TMR operation to be performed on the banks in response to the mat information signal MAT_SEL the enable signal TMR_EN, the normal refresh counting signal REF_CNT, the target refresh counting signal TMR_CNT, and the refresh command REF.

The target mat determination unit 141 determines a direct target mat in which a row hammering is highly likely to occur and enables the TMR operation, in response to the mat counting signals MAT0_CNT to MATn_CNT. In other words, the target mat determination unit 141 provides the mat information signal MAT_SEL, corresponding to the direct target mat in which row hammering is highly likely to occur, to the refresh operation unit 147 in response to the mat counting signals MAT0_CNT to MATn_CNT. Furthermore, the target mat determination unit 141 provides the enable signal TRM_EN for enabling the TMR operation, to the refresh operation unit 147.

When the enable signal TRM_EN is deactivated, the refresh operation unit 147 outputs a row active signal RACT, which is activated one time within a refresh period corresponding to the refresh command REF, and outputs an address based on a normal refresh operation as a refresh address REF_ADD during the refresh period. On the other hand, when the enable signal TMR_EN is activated, the refresh operation unit 147 outputs a row active signal RACT, which is activated two times within the refresh period corresponding to the refresh command REF, and sequentially outputs a general address for the normal refresh operation and a target address for the TMR operation as the refresh address REF_ADD during the refresh period. For example, the refresh period corresponding to the refresh command REF includes a refresh row cycle time (tRFC)

Hereafter, an operation method of the semiconductor device in accordance with the embodiment of the present invention will be described with reference to FIGS. 1 to 3.

Figure 3:
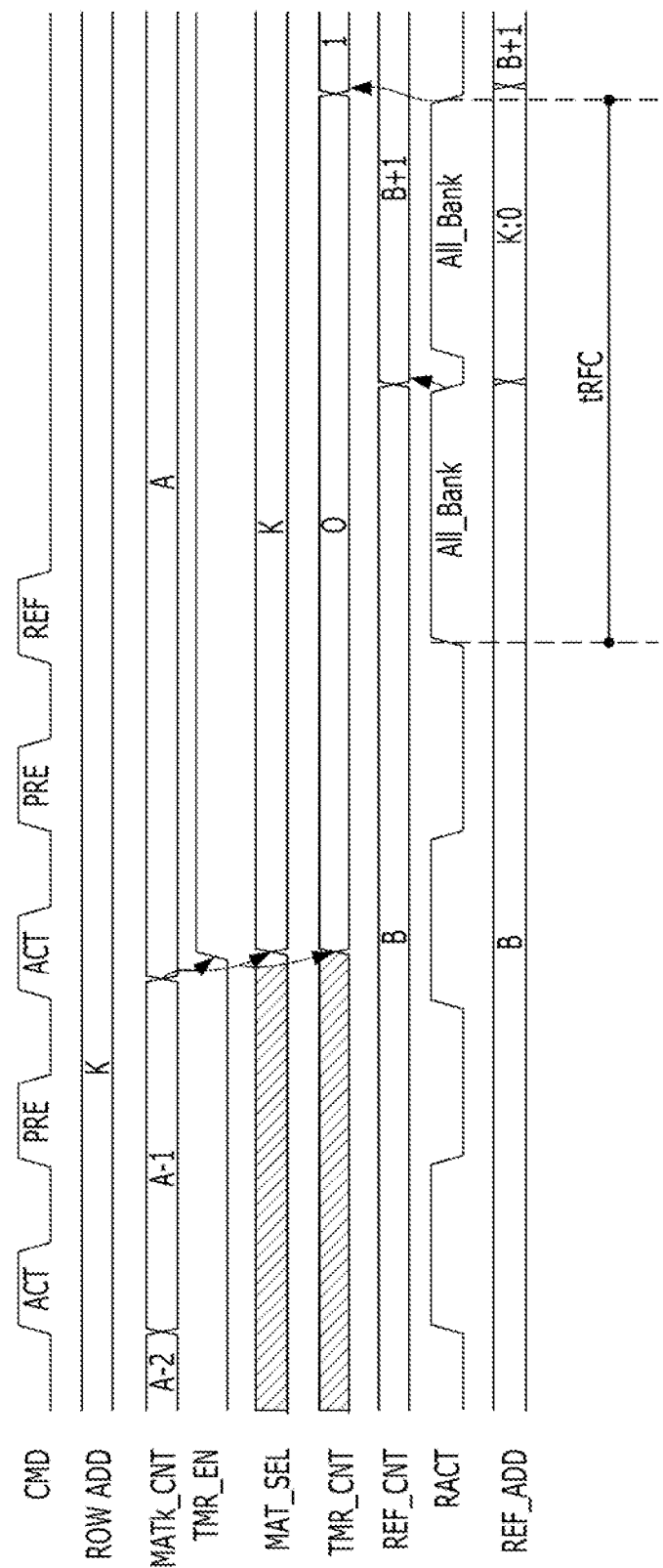
FIG. 3 is a timing diagram for explaining an operation method of the semiconductor device in accordance with the embodiment of the present invention.

FIG. 3 is a timing diagram for explaining the operation method of the semiconductor device in accordance with the embodiment of the present invention.

Referring to FIGS. 1 to 3, the operation method of the semiconductor device 100 includes the steps of: counting the number of active operations on the respective memory cell blocks (e.g., mats) based on the internal active command ACT and the row address ROW_ADD, determining a target mat (or a direct target mat) in which a row hammering is highly likely to occur, based on the counting result; and performing a TMR operation on the target mat (or the direct target mat and an indirect target mat at the same time), when the refresh command REF is inputted.

At the step of selecting the direct target mat, the target mat determination unit 141 selects a mat, which is activated a predetermined number or more, as the direct target mat in response to the mat counting signals MAT0_CNT to MATn_CNT, and generates the mat information signal MAT_SEL corresponding to the direct target mat. At this time, the target mat determination unit 141 activates the enable signal TMR_EN for guiding whether or not a row hammering occurred.

At the step of performing the TMR operation, the refresh operation unit 147 generates the row active signal RACT, which is activated two times within a refresh period corresponding to the refresh command REF. Here, during a first activated period of the row active signal RACT, a normal refresh operation may be performed, and during a second activated period of the row active signal RACT, a TMR operation may be performed. Furthermore, the refresh operation unit 147 sequentially may output a general address for the normal refresh operation and a target address for the TMR operation as the refresh address REF_ADD, in response to the first activated period and the second activated period of the row active signal RACT. The step of performing the TMR operation is performed until all rows included in the target mat are refreshed (or activated). At this time, whether all rows of the target mat are refreshed or not may be informed by the target counter 145.

In accordance with the embodiments of the present invention, the circuit area for the counting unit may be minimized, while mitigating a row hammering.

Although various embodiments have been described for illustrative purposes it will be apparent to those skilled in the art that various changes and modifications may be made without departing from the spirit and scope of the invention as defined in the following claims.

For example, in the embodiments of the present invention, it has been described that the counting unit counts the number of active operations on the respective mats. However, the present invention is not limited thereto, and the counting unit may count the number of active operations on each of the two or more mats. In this case, the circuit area of the counting unit may be reduced.

Furthermore, it has been described that when a row hammering occurs, one normal refresh operation and one TMR operation are sequentially performed in response to each refresh command. However, two or more normal refresh operations and two or more TMR operations may be sequentially performed in response to each refresh command.

What is claimed is:

1. A semiconductor device comprising:
a plurality of memory cell blocks;
a counting unit suitable for counting the number of active operations on each of the memory cell blocks, based on an active command and a row address; and
a refresh control unit suitable for determining a target memory cell block among the memory cell blocks and controlling an additional refresh operation for the target memory cell block to be performed based on the counting result,
wherein the refresh control unit controls a normal refresh operation to be sequentially performed on the memory cell blocks during a normal refresh mode, and controls the additional refresh operation to be performed on the target memory cell block, and
wherein the additional refresh operation is performed on all rows of the target cell block.

2. The semiconductor device of claim 1, wherein the refresh control unit controls the normal refresh operation and the additional refresh operation to be sequentially performed in a unit of row, when a refresh command is inputted.

3. A semiconductor device comprising:
a plurality of mats;
a counting unit suitable for counting the number of active operations on each of the mats, based on an active command and a row address;
a target mat determination unit suitable for generating a mat information signal corresponding to a target mat among the mats and an enable signal for enabling an additional refresh operation based on the counting result; and
a refresh operation unit suitable for generating a row active signal and a refresh address for controlling a normal refresh operation for the mats and the additional refresh operation for the target mat, based on the mat information signal, the enable signal, a refresh command,
a normal counter suitable for counting the number of the normal refresh operations on the mats and outputting a normal refresh counting signal to the refresh operation unit; and
a target counter suitable for counting the number of normal refresh operations on the target mat and outputting a target refresh counting signal depending on whether all rows of the target mat are refreshed or not.

4. The semiconductor device of claim 3, wherein, when the enable signal is activated, the refresh operation unit generates the row active signal, which is activated two times within a refresh period corresponding to the refresh command, and sequentially generates an address for the normal refresh operation and an address for the additional refresh operation as the refresh address, during the refresh period.

5. The semiconductor device of claim 4, wherein the refresh period comprises a refresh row cycle time (tRFC).

6. An operation method of a semiconductor device with a plurality of memory cell blocks each having a plurality of rows, the operation method comprising:
counting the number of active operations on the corresponding memory cell block;
determining a memory cell block, which is activated a predetermined number or more, as a direct target cell block based on the counting result; and
performing an additional refresh operation on the target cell block, when a refresh command is inputted,
wherein the additional refresh operation and a normal refresh operation for the memory cell block are sequentially performed during a refresh period corresponding to the refresh command, and
wherein the normal refresh operation and the additional refresh operation are performed on all rows of the target cell block.

7. The operation method of claim 6, wherein the refresh period comprises a refresh row cycle time (tRFC).

* * * * *